US009543303B1

(12) United States Patent
Huang

(10) Patent No.: US 9,543,303 B1
(45) Date of Patent: Jan. 10, 2017

(54) COMPLEMENTARY METAL OXIDE SEMICONDUCTOR DEVICE WITH DUAL-WELL AND MANUFACTURING METHOD THEREOF

(71) Applicant: RICHTEK TECHNOLOGY CORPORATION, Zhubei, Hsinchu (TW)

(72) Inventor: Tsung-Yi Huang, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/136,917

(22) Filed: Apr. 23, 2016

Related U.S. Application Data

(63) Continuation-in-part of application No. 15/066,207, filed on Mar. 10, 2016.

(30) Foreign Application Priority Data

Feb. 2, 2016 (CN) .......................... 2016 1 0072078

(51) Int. Cl.
| | | |
|---|---|---|
| H01L 29/78 | (2006.01) |
| H01L 27/092 | (2006.01) |
| H01L 29/06 | (2006.01) |
| H01L 29/10 | (2006.01) |
| H01L 21/8238 | (2006.01) |
| H01L 21/762 | (2006.01) |
| H01L 21/8234 | (2006.01) |

(52) U.S. Cl.
CPC ..... *H01L 27/0928* (2013.01); *H01L 21/76202* (2013.01); *H01L 21/823814* (2013.01); *H01L 21/823878* (2013.01); *H01L 21/823892* (2013.01); *H01L 29/0649* (2013.01); *H01L 29/1095* (2013.01); *H01L 29/7835* (2013.01); *H01L 21/823493* (2013.01); *H01L 29/7816* (2013.01)

(58) Field of Classification Search
CPC .................... H01L 21/823493; H01L 29/7816; H01L 29/7835
USPC .................. 438/217, 218, 226, 228; 257/336
See application file for complete search history.

(56) References Cited

U.S. PATENT DOCUMENTS

| | | | |
|---|---|---|---|
| 7,989,889 B1* | 8/2011 | Kerr ..................... | H01L 29/1045 257/335 |
| 2005/0006701 A1* | 1/2005 | Sung ............... | H01L 21/823814 257/339 |

(Continued)

*Primary Examiner* — George Fourson, III
(74) *Attorney, Agent, or Firm* — Tung & Associates

(57) ABSTRACT

The present invention discloses a dual-well complementary metal oxide semiconductor (CMOS) device and a manufacturing method thereof. The dual-well CMOS device includes a PMOS device region and an NMOS device region. Each of the PMOS and NMOS device regions includes a dual-well (which includes a P-well and an N-well), and each of the PMOS and NMOS device regions includes P-type and N-type lightly doped diffusions (PLDD and NLDD) regions respectively in different wells in the dual well. A separation region is located between the PMOS device region and the NMOS device region, for separating the PMOS device region and the NMOS device region. The depth of the separation region is not less than the depth of any of the P-wells and the N-wells in the PMOS device region and the NMOS device region.

14 Claims, 7 Drawing Sheets

(56) References Cited

U.S. PATENT DOCUMENTS

| | | | |
|---|---|---|---|
| 2006/0027874 A1* | 2/2006 | Tsai | H01L 29/7835 257/365 |
| 2006/0049452 A1* | 3/2006 | Tsai | H01L 29/086 257/328 |
| 2008/0237703 A1* | 10/2008 | Lin | H01L 29/66659 257/336 |
| 2011/0266620 A1* | 11/2011 | Terrill | H01L 21/743 257/343 |
| 2013/0161750 A1* | 6/2013 | Chen | H01L 27/0266 257/357 |
| 2014/0203358 A1* | 7/2014 | Yang | H01L 29/7835 257/335 |

* cited by examiner

US 9,543,303 B1

COMPLEMENTARY METAL OXIDE SEMICONDUCTOR DEVICE WITH DUAL-WELL AND MANUFACTURING METHOD THEREOF

CROSS REFERENCE

The present invention claims priority to CN 201610072078.3, filed on Feb. 2, 2016; the present invention is a continuation-in-part application of U.S. Ser. No. 15/066,207, filed on Mar. 10, 2016.

BACKGROUND OF THE INVENTION

Field of Invention

The present invention relates to a complementary metal oxide semiconductor (CMOS) device with dual-wells and a manufacturing method thereof; particularly, it relates to such a CMOS device with dual-wells having a reduced conduction resistance and an increased breakdown voltage, and a manufacturing method thereof.

Description of Related Art

FIG. 1 shows a cross-section view of a prior art complementary metal oxide semiconductor (CMOS) device 100, which includes: a P-type substrate 101, an epitaxial layer 102, a P-type well 103a, an N-type well (N-well) 103b, an isolation region 104, N-type lightly doped diffusion (NLDD) regions 105a and 105b, P-type lightly doped diffusion (PLDD) regions 105c and 105d, an N-type source 106a, a P-type source 106b, an N-type drain 107a, a P-type drain 107b, a P-type body region 108a, an N-type body region 108b, and gates 111a and 111b. The isolation region 104 is formed by local oxidation of silicon (LOCOS), to define an NMOS operation region 104a and a PMOS operation region 104b, which are major operation regions of the CMOS device 100. The operation regions 104a and 104b are indicated by the solid arrows shown in FIG. 1. The CMOS device 100 includes the NMOS operation region 104a and the PMOS operation region 104b. In the NMOS operation region 104a, the N-type source 106a and the NLDD region 105a are at one side with respect to the gate 111a, and are connected to each other; the N-type drain 107a and the NLDD region 105b are at the other side with respect to the gate 111a, and are connected to each other. The two connected regions at two sides of the gate 111a are separated by the P-type well 103a. Similarly, in the PMOS operation region 104b, the P-type source 106b and the PLDD region 105c are at one side with respect to the gate 111b, and are connected to each other; the P-type drain 107b and the PLDD region 105d are at the other side with respect to the gate 111b, and are connected to each other. The two connected regions at two sides of the gate 111b are separated by the N-type well 103b.

An important trend in the field of semiconductor device is to reduce the device size; however, as the channel of the CMOS device is shortened, a short channel effect (SCE) caused by drain-induced barrier lowering (DIBL) and hot carrier effect (HCE) will occur. The details of these effects are well-known by one skilled in the art, so they are not redundantly explained here.

As an example, for a CMOS device having a gate operation voltage of 5V, when the gate length is shorter than 0.6 μm, the SCE starts to occur. Because of the SCE, the gate length cannot be shorter, unless some solution is proposed to solve this SCE effect. That is, an effective solution is required for a CMOS device to be able to operate under certain given operation voltage, and integrated with other devices (or connected in parallel with other CMOS devices of the same characteristics) in a circuit, without SCE, while with a reduced size.

In view of above, to overcome the drawbacks in the prior art, the present invention proposes a dual-well CMOS device having a reduced conduction resistance and an increased breakdown voltage, and a manufacturing method thereof.

SUMMARY OF THE INVENTION

In one perspective, the present invention provides a dual-well CMOS device. The dual-well CMOS device includes: a substrate, including a top surface and a bottom surface opposite to the top surface in a vertical direction; an epitaxial layer, which is formed on and connects at least a portion of the top surface of the substrate, the epitaxial layer including an epitaxial top surface opposite to the top surface in the vertical direction; an isolation region, which is formed on the epitaxial layer, and configured to define an NMOS device region and a PMOS device region in the epitaxial layer; a first P-type well (P-well), which is formed in the NMOS device region of the epitaxial layer and located under the epitaxial top surface in the vertical direction; a P-type body region, which is formed on the first P-well in the epitaxial layer, and is located between the first P-well and the epitaxial top surface in the vertical direction; a first N-type well (N-well), which is formed in the NMOS device region of the epitaxial layer and located under the epitaxial top surface in the vertical direction, and connects the first P-well in a lateral direction, to form a first PN junction between the first N-well and the first P-well; a first gate, which is formed in the NMOS device region, and is stacked on and connects the epitaxial top surface in the vertical direction; a first P-type lightly doped diffusion (PLDD) region, which is formed on the first P-well in the epitaxial layer, and is located between the epitaxial top surface and the first P-well in the vertical direction; a first N-type lightly doped diffusion (NLDD) region, which is formed on the first N-well in the epitaxial layer, and is located between the epitaxial top surface and the first N-well in the vertical direction; an N-type source, which is formed on the first P-well in the epitaxial layer, and is located between the epitaxial top surface and the first P-well in the vertical direction, wherein the N-type source connects the P-type body region and the first PLDD region in the lateral direction; an N-type drain, which is formed on the first N-well in the epitaxial layer, and is located between the epitaxial top surface and the first N-well in the vertical direction, wherein the N-type drain connects the first NLDD region in the lateral direction; a second N-type well (N-well), which is formed in the PMOS device region of the epitaxial layer and located under the epitaxial top surface in the vertical direction; an N-type body region, which is formed on the second N-well in the epitaxial layer, and is located between the second N-well and the epitaxial top surface in the vertical direction; a second P-type well (P-well), which is formed in the PMOS device region of the epitaxial layer and located under the epitaxial top surface in the vertical direction, and connects the second N-well in the lateral direction, to form a second PN junction between the second N-well and the second P-well; a second gate, which is formed in the PMOS device region, and is stacked on and connects the epitaxial top surface in the vertical direction; a second N-type lightly doped diffusion (NLDD) region, which is formed on the second N-well in the epitaxial layer, and is located between the epitaxial top surface and the second N-well in the vertical direction; a second P-type lightly doped diffusion (PLDD) region, which is formed on the second P-well in the epitaxial layer, and is located between the epitaxial top surface and the second P-well in the vertical direction; a P-type source, which is formed on the second N-well in the epitaxial layer, and is located between the epitaxial top surface and the second N-well in the vertical direction, wherein the P-type source connects the N-type body region and the second NLDD region in the lateral direction; a P-type drain, which is formed on the second P-well in the epitaxial layer, and is located between the epitaxial top surface and the second P-well in the vertical direction, wherein the P-type drain connects the second PLDD region in the lateral direction; and a separation region, which is connected between the PMOS device region and the NMOS device region, for separating the PMOS device region and the NMOS device region, wherein a depth of the separation region, which is measured from the epitaxial top surface downward, is not smaller than a depth of any of the first P-well, the first N-well, the second N-well, and the second P-well; wherein, the first PN junction is located between the first PLDD region and the first NLDD region; wherein, the second PN junction is located between the second PLDD region and the second NLDD region.

In one perspective, the present invention also provides a manufacturing method of a dual-well complementary metal oxide semiconductor (CMOS) device. The manufacturing method includes: providing a substrate, which includes a top surface and a bottom surface opposite to the top surface in a vertical direction; forming an epitaxial layer on and connecting at least a portion of the top surface of the substrate, the epitaxial layer including an epitaxial top surface opposite to the top surface in the vertical direction; forming an isolation region on the epitaxial layer, to define an NMOS device region and a PMOS device region in the epitaxial layer; forming a first P-type well (P-well) in the NMOS device region of the epitaxial layer, under the epitaxial top surface in the vertical direction; forming a P-type body region on the first P-well in the epitaxial layer, between the first P-well and the epitaxial top surface in the vertical direction; forming a first N-type well (N-well) in the NMOS device region of the epitaxial layer, under the epitaxial top surface in the vertical direction, wherein the first N-well connects the first P-well in a lateral direction, to form a first PN junction between the first N-well and the first P-well; forming a first gate in the NMOS device region, wherein the first gate is stacked on and connects the epitaxial top surface in the vertical direction; forming a first P-type lightly doped diffusion (PLDD) region on the first P-well in the epitaxial layer, between the epitaxial top surface and the first P-well in the vertical direction; forming a first N-type lightly doped diffusion (NLDD) region on the first N-well in the epitaxial layer, between the epitaxial top surface and the first N-well in the vertical direction; forming an N-type source on the first P-well in the epitaxial layer, between the epitaxial top surface and the first P-well in the vertical direction, wherein the N-type source connects the P-type body region and the first PLDD region in the lateral direction; forming an N-type drain on the first N-well in the epitaxial layer, between the epitaxial top surface and the first N-well in the vertical direction, wherein the N-type drain connects the first NLDD region in the lateral direction; forming a second N-type well (N-well) in the PMOS device region of the epitaxial layer, under the epitaxial top surface in the vertical direction; forming an N-type body region on the second N-well in the epitaxial layer, between the second N-well and the epitaxial top surface in the vertical direction; forming a second P-type well (P-well) in the PMOS device region of the epitaxial layer, under the epitaxial top surface in the vertical direction, wherein the second P-well connects the second N-well in a lateral direction, to form a second PN junction between the second N-well and the second P-well; forming a second gate in the PMOS device region, wherein the second gate is stacked on and connects the epitaxial top surface in the vertical direction; forming a second N-type lightly doped diffusion (NLDD) region on the second N-well in the epitaxial layer, between the epitaxial top surface and the second N-well in the vertical direction; forming a second P-type lightly doped diffusion (PLDD) region on the second P-well in the epitaxial layer, between the epitaxial top surface and the second P-well in the vertical direction; forming a P-type source on the second N-well in the epitaxial layer, between the epitaxial top surface and the second N-well in the vertical direction, wherein the P-type source connects the N-type body region and the second NLDD region in the lateral direction; forming a P-type drain on the second P-well in the epitaxial layer, between the epitaxial top surface and the second P-well in the vertical direction, wherein the P-type drain connects the second PLDD region in the lateral direction; and forming a separation region, which is connected between the PMOS device region and the NMOS device region, for separating the PMOS device region and the NMOS device region, wherein a depth of the separation region, which is measured from the epitaxial top surface downward, is not smaller than a depth of any of the first P-well, the first N-well, the second N-well, and the second P-well; wherein, the first PN junction is located between the first PLDD region and the first NLDD region; wherein, the second PN junction is located between the second PLDD region and the second NLDD region.

In one preferable embodiment, the isolation region includes a local oxidation of silicon (LOCOS) structure or a shallow trench isolation (STI) structure.

In one preferable embodiment, an impurity concentration of the first PLDD region is higher than an impurity concentration of the first P-well, and an impurity concentration of the first NLDD region is higher than an impurity concentration of the first N-well.

In one preferable embodiment, an impurity concentration of the second PLDD region is higher than an impurity concentration of the second P-well, and an impurity concentration of the second NLDD region is higher than an impurity concentration of the second N-well.

In one preferable embodiment, the CMOS device further includes an N-type buried layer, which is formed at or around an interface between the substrate and the epitaxial layer, the N-type buried layer upwardly connecting the second P-well in the vertical direction.

In one preferable embodiment, the separation region includes a deep trench isolation (DTI) structure.

In one preferable embodiment, the separation region includes: a P-type separation region, which is formed in the NMOS device region of the epitaxial layer, the P-type separation region upwardly connecting the epitaxial top surface in the vertical direction, and the P-type separation region laterally connecting the first N-well in the lateral direction; and an N-type separation region, which is formed in the PMOS device region of the epitaxial layer, the N-type separation region upwardly connecting the epitaxial top surface in the vertical direction, and the N-type separation region laterally connecting the second P-well in the lateral direction.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 2:
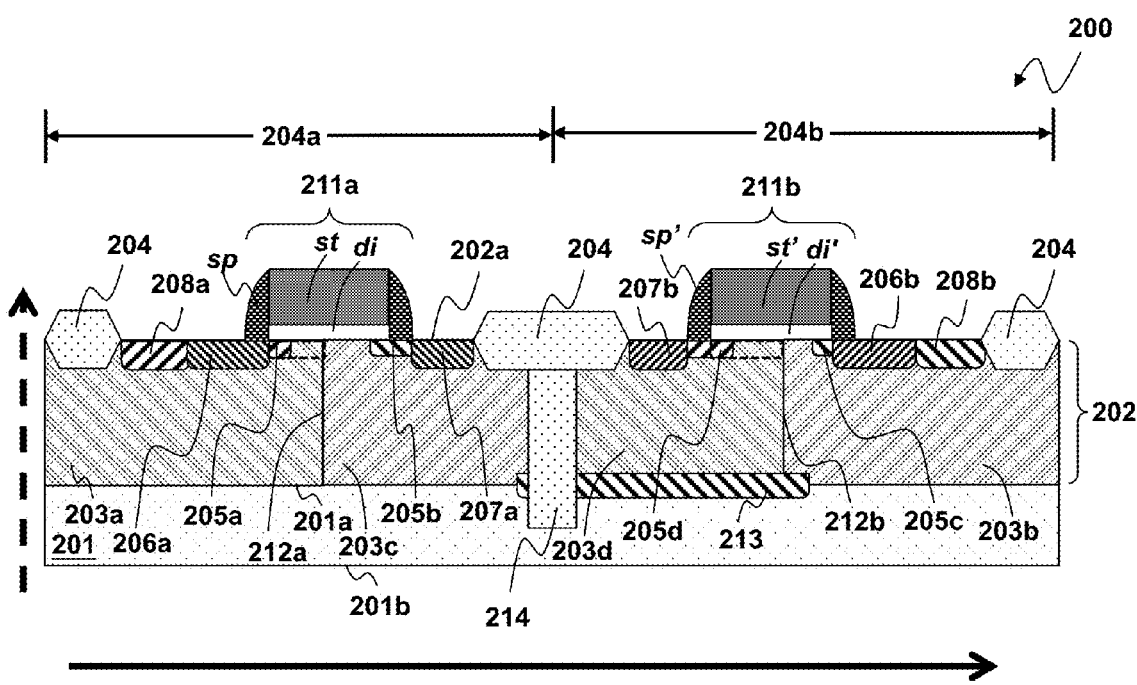
FIG. 2 shows a first embodiment of the present invention.

Please refer to FIG. 2 for a first embodiment according to the present invention, wherein FIG. 2 shows a cross-section view of a dual-well CMOS device 200. The dual-well CMOS device 200 includes: a substrate 201, an epitaxial layer 202, P-type wells (P-wells) 203a and 203d, N-type wells (N-wells) 203b and 203c, an isolation region 204, PLDD regions 205a and 205d, NLDD regions 205b and 205c, an N-type source 206a, an N-type drain 207a, a P-type source 206b, a P-type drain 207b, a P-type body region 208a, an N-type body region 208b, gates 211a and 211b, an N-type buried layer 213, and a separation region 214.

The substrate 201 includes a top surface 201a and a bottom surface 201b opposite to the top surface 201a in a vertical direction (as shown by the dash arrow in the figure). The epitaxial layer 202 is formed on the substrate 201, i.e., the epitaxial layer 202 is stacked on and connects at least a portion of the top surface 201a of the substrate 201. The epitaxial layer 202 includes an epitaxial top surface 202a opposite to the top surface 201a. The isolation region 204 is formed on the epitaxial layer 202, for defining an NMOS device region 204a and a PMOS device region 204b in the epitaxial layer (as indicated by the two-way arrows in the figure).

The P-well 203a is formed in the NMOS device region 204a of the epitaxial layer 202 and located under the epitaxial top surface 202a in the vertical direction. The P-type body region 208a is formed on the P-well 203a in the epitaxial layer 202, and it is located between the P-well 203a and the epitaxial top surface 202a in the vertical direction. The N-well 203c is formed in the NMOS device region 204a of the epitaxial layer 202 and located under the epitaxial top surface 202a in the vertical direction, and the N-well 203c connects the P-well 203a in a lateral direction (as shown by the solid arrow in the figure), to form a PN junction 212a between the P-well 203a and the N-well 203c. The gate 211a is formed on the epitaxial top surface 202a in the NMOS device region 204a, i.e., it is stacked on and connects the epitaxial top surface 202a in the vertical direction. The gate 211a includes a dielectric layer di, a gate conductive layer st, and a spacer layer sp. The dielectric layer di is formed on and connects the epitaxial layer 202a. The gate conductive layer st is formed on the dielectric layer di, and it includes a conductive material so as to form an electrical contact of the gate 211a. The gate conductive layer st also functions as a self-aligned mask for forming the PLDD region 205a and the NLDD region 205b. The spacer layer sp is formed on the epitaxial top surface 202a outside the side walls of the gate conductive layer st, to enclose the side walls of the gate conductive layer st. The spacer layer sp includes an insulating material, and the spacer layer sp also functions as a self-aligned mask for forming the N-type source 206a and the N-type drain 207a.

The PLDD region 205a is formed on the P-well 203a in the epitaxial layer 202 by a self-aligned process. The PLDD region 205a is located between the epitaxial top surface 202a and the P-well 203a in the vertical direction. The NLDD region 205b is formed on the N-well 203c in the epitaxial layer 202 by a self-aligned process. The NLDD region 205b is located between the epitaxial top surface 202a and the N-well 203c in the vertical direction. The N-type source 206a is formed on the P-well 203a in the epitaxial layer 202. The N-type source 206a is located between the epitaxial top surface 202a and the P-well 203a in the vertical direction, and the N-type source 206a connects the P-type body region 208a and the PLDD region 205a in the lateral direction. The N-type drain 207a is formed on the N-well 203c in the epitaxial layer 202. The N-type drain 207a is located between the epitaxial top surface 202a and the N-well 203c in the vertical direction, and the N-type drain 207a connects the NLDD region 205b in the lateral direction. A PN junction 212a is formed in the NMOS device region 204a, and the PN junction 212a is located between the PLDD region 205a and the NLDD region 205b.

The N-well 203b is formed in the PMOS device region 204b of the epitaxial layer 202 and located under the epitaxial top surface 202a in the vertical direction. The N-type body region 208b is formed on the N-well 203b in the epitaxial layer 202, and it is located between the N-well 203b and the epitaxial top surface 202a in the vertical direction. The P-well 203d is formed in the PMOS device region 204b of the epitaxial layer 202 and located under the epitaxial top surface 202a in the vertical direction, and the P-well 203d connects the N-well 203b in a lateral direction (as shown by the solid arrow in the figure), to form a PN junction 212b between the P-well 203d and the N-well 203b. The gate 211b is formed on the epitaxial top surface 202a in the PMOS device region 204b, i.e., it is stacked on and connects the epitaxial top surface 202a in the vertical direction. The gate 211b includes a dielectric layer di', a gate conductive layer st', and a spacer layer sp'. The dielectric layer di' is formed on and connects the epitaxial layer 202a. The gate conductive layer st' is formed on the dielectric layer di', and it includes a conductive material so as to form an electrical contact of the gate 211b. The gate conductive layer st' also functions as a self-aligned mask for forming the NLDD region 205c and the PLDD region 205d. The spacer layer sp' is formed on the epitaxial top surface 202a outside the side walls of the gate conductive layer st', to enclose the side walls of the gate conductive layer st'. The spacer layer sp' includes an insulating material, and the spacer layer sp' also functions as a self-aligned mask for forming the P-type source 206b and the P-type drain 207b.

The NLDD region 205c is formed on the N-well 203b in the epitaxial layer 202 by a self-aligned process. The NLDD region 205c is located between the epitaxial top surface 202a and the N-well 203b in the vertical direction. The PLDD region 205d is formed on the P-well 203d in the epitaxial layer 202 by a self-aligned process. The PLDD region 205d is located between the epitaxial top surface 202a and the P-well 203d in the vertical direction. The P-type source 206b is formed on the N-well 203b in the epitaxial layer 202. The P-type source 206b is located between the epitaxial top surface 202a and the N-well 203b in the vertical direction, and the P-type source 206b connects the N-type body region 208b and the NLDD region 205c in the lateral direction. The P-type drain 207b is formed on the P-well 203d in the epitaxial layer 202. The P-type drain 207b is located between the epitaxial top surface 202a and the P-well 203d in the vertical direction, and the P-type drain 207b connects the PLDD region 205d in the lateral direction. A PN junction 212b is formed in the PMOS device region 204b, and the PN junction 212b is located between the NLDD region 205c and the PLDD region 205d.

The NMOS device region 204a and PMOS device region 204b are defined by the isolation region 204 formed on the epitaxial layer 202. The P-type body region 208a, the gate 211a, the PLDD region 205a, the NLDD region 205b, the N-type source 206a, and the N-type drain 207a are located in the NMOS device region 204a. The N-type body region 208b, the gate 211b, the NLDD region 205c, the PLDD region 205d, the P-type source 206b, and the P-type drain 207b are located in the PMOS device region 204b. In one preferred embodiment, the PLDD region 205a is only in direct contact with the N-type source 206a, the dielectric layer di, and the P-well 203a; the NLDD region 205b is only in direct contact with the N-type drain 207a, the dielectric layer di, and the N-well 203c. In one preferred embodiment, the NLDD region 205c is only in direct contact with the P-type source 206b, the dielectric layer di', and the N-well 203b; the PLDD region 205d is only in direct contact with the P-type drain 207b, the dielectric layer di', and the P-well 203d.

In one preferred embodiment, the dual-well CMOS device 200 further includes for example but not limited to an N-type buried layer 213, which is formed at or around an interface between the substrate 201 and the epitaxial layer 202. The N-type buried layer 213 upwardly connects the P-well 203d in the vertical direction. At least a majority portion of the N-type buried layer 213 is located below the P-well 203d, to separate the P-well 203d and the substrate 201, such that the P-well 203d and the substrate 201 are not electrically shorted.

The separation region 214 is connected between the PMOS device region 204b and the NMOS device region 204a, for separating the PMOS device region 204b and the NMOS device region 204a. A depth of the separation region 214, as measured from the epitaxial top surface 202a in the vertical direction, is preferably not smaller than a depth of any one of the P-well 203a, the N-well 203c, the N-well 203b, and the P-well 203d.

In one preferred embodiment, the PLDD region 205a has an impurity concentration which is higher than an impurity concentration of the P-well 203a, and the NLDD region 205b has an impurity concentration which is higher than an impurity concentration of the N-well 203c. For example, the impurity concentration of the PLDD region 205a may be 2-10 folds of the impurity concentration of the P-well 203a; the impurity concentration of the NLDD region 205b may be 2-10 folds of the impurity concentration of the N-well 203c. The impurity concentration described above refers to a planar dopant concentration parameter executed in an ion implantation process. Usually, after annealing process, a three-dimensional dopant concentration is formed and the three-dimensional dopant concentration is lower than the planar dopant concentration, as well-known by one skilled in the art. By the dopant concentration design in this embodiment, the HCE of the SCE can be alleviated.

In one preferred embodiment, for example, as shown in FIG. 2, the separation region 214 includes a deep trench isolation (DTI) structure.

Figure 3A:
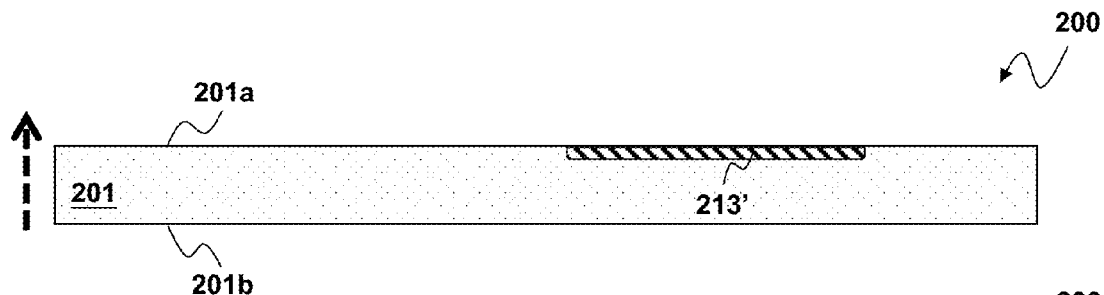
FIGS. 3A-3I show a second embodiment of the present invention.
Figure 3B:
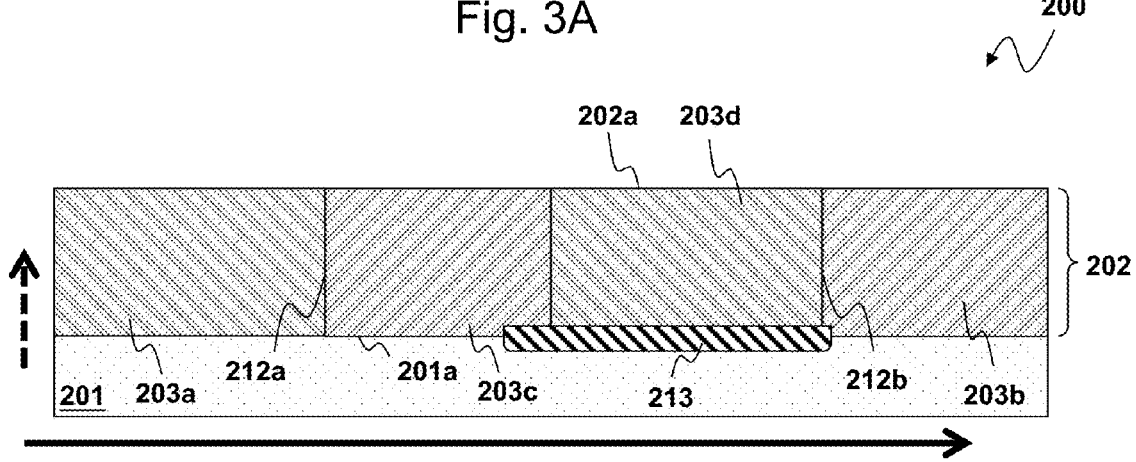

FIGS. 3A-3I show a second embodiment of the present invention. FIGS. 3A-3I show cross-section views according to a manufacturing method of the dual-well CMOS device 200 of the present invention. As shown in FIG. 3A, a substrate 201 is provided, which is for example but not limited to a P-type silicon substrate. The substrate 201 includes a top surface 201a and a bottom surface 201b opposite to the top surface 201a in a vertical direction (as shown by the dash arrow in the figure). Next, an N-type ion implantation region 213' for forming an N-type buried layer 213 is formed by a lithography process and an ion implantation process. Next, as shown in FIG. 3B, an epitaxial layer 202 is formed on and connects the top surface 201a of the substrate 201. The epitaxial layer 202 includes an epitaxial top surface 202a opposite to the top surface 201a in the vertical direction. Next, the N-type buried layer 213 is formed at or around an interface between the substrate 201 and the epitaxial layer 202 by a thermal process.

Next, still referring to FIG. 3B, P-wells 203a and 203d are formed in the epitaxial layer 202. The P-wells 203a and 203d are stacked on the top surface 201a of the substrate 201 in the vertical direction, and the P-wells 203a and 203d are located under the epitaxial top surface 202a. N-wells 203b and 203c are formed in the epitaxial layer 202 and located under the epitaxial top surface 202a in the vertical direction. The N-wells 203b and 203c connect the P-wells 203d and 203a respectively in the lateral direction, to form a PN junction 212a between the P-well 203a and the N-well 203c, and a PN junction 212b between the P-well 203d and the N-well 203b. The PN junction 212a is located between a PLDD region 205a and an NLDD region 205b which will be formed in later process steps. The PN junction 212b is located between a PLDD region 205d and an NLDD region 205c which will be formed in later process steps. The P-wells 203a and 203d, and the N-wells 203b and 203c can be formed by, for example but not limited to, processes including a lithography process, an ion implantation process, and a thermal process (not shown), which are well-known by one skilled in the art, and the details of these processes are not redundantly described herein.

Figure 3C:
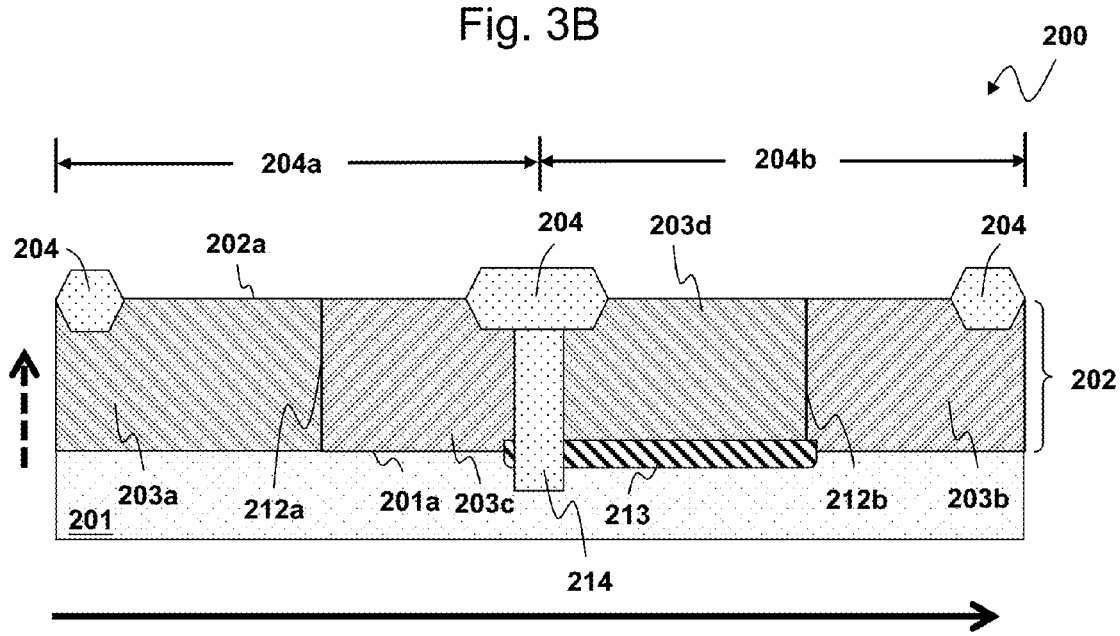

Next, referring to FIG. 3C, a separation region 214 is formed and connected between the PMOS device region 204b and the NMOS device region 204a, for separating the PMOS device region 204b and the NMOS device region 204a. The separation region 214 includes for example but not limited to a deep trench isolation (DTI) structure as shown in the figure, wherein the DTI structure is as well known by those skilled in the art, so details thereof are omitted here. Next, an isolation region 204 is formed on the epitaxial layer 202, to define an NMOS device region 204a and a PMOS device region 204b. A P-type body region 208a, a gate 211a, the PLDD region 205a, the NLDD region 205b, an N-type source 206a, and an N-type drain 207a which will be formed in later process steps are located in the NMOS device region 204a; and an N-type body region 208b, a gate 211b, the NLDD region 205c, the PLDD region 205d, a P-type source 206b, and a P-type drain 207b which will be formed in later process steps are located in the PMOS device region 204b. The isolation region 204 for example can be formed by a local oxidation of silicon (LOCOS) process or by a shallow trench isolation (STI) process. In FIG. 3C, the isolation region 204 has a LOCOS structure. In another embodiment which will be shown by FIG. 5, the isolation region 204 has an STI structure.

Figure 3D:
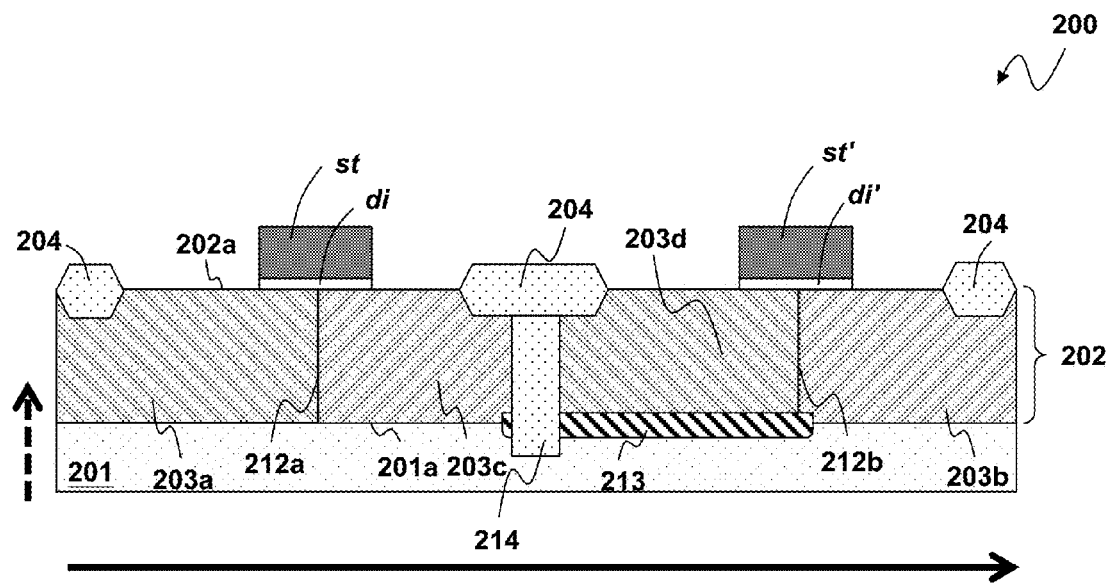

Next, as shown in FIG. 3D, dielectric layers di and di', and gate conductive layers st and st' are formed on the epitaxial top surface 202a. The dielectric layers di and di' are stacked on and connects the epitaxial top surface 202a in the vertical direction, and the gate conductive layer st and st' are stacked on and connects the dielectric layer di and di' respectively.

Figure 3E:
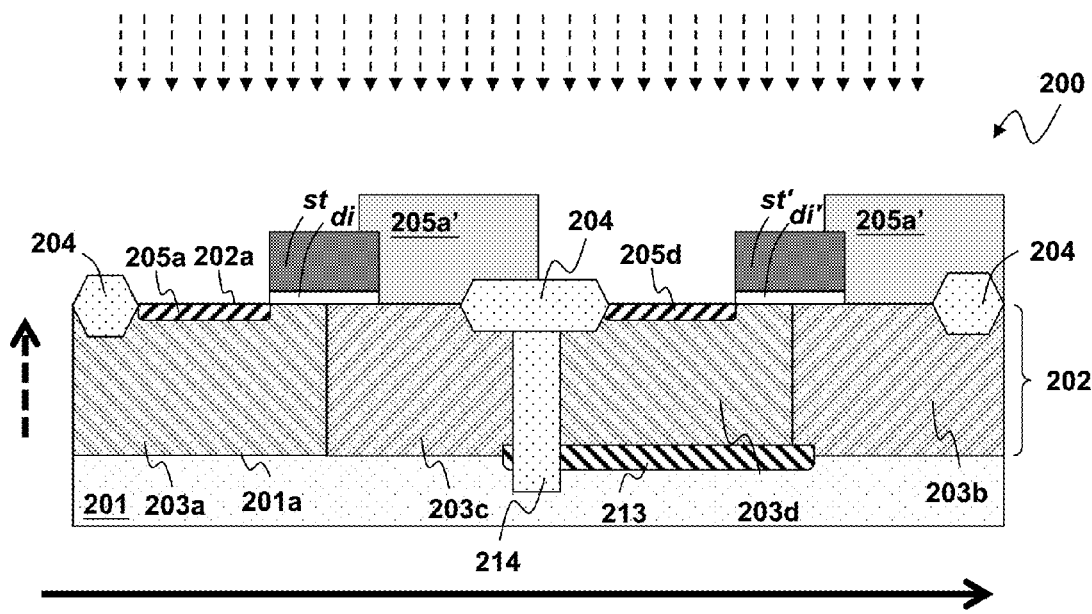
Figure 3F:
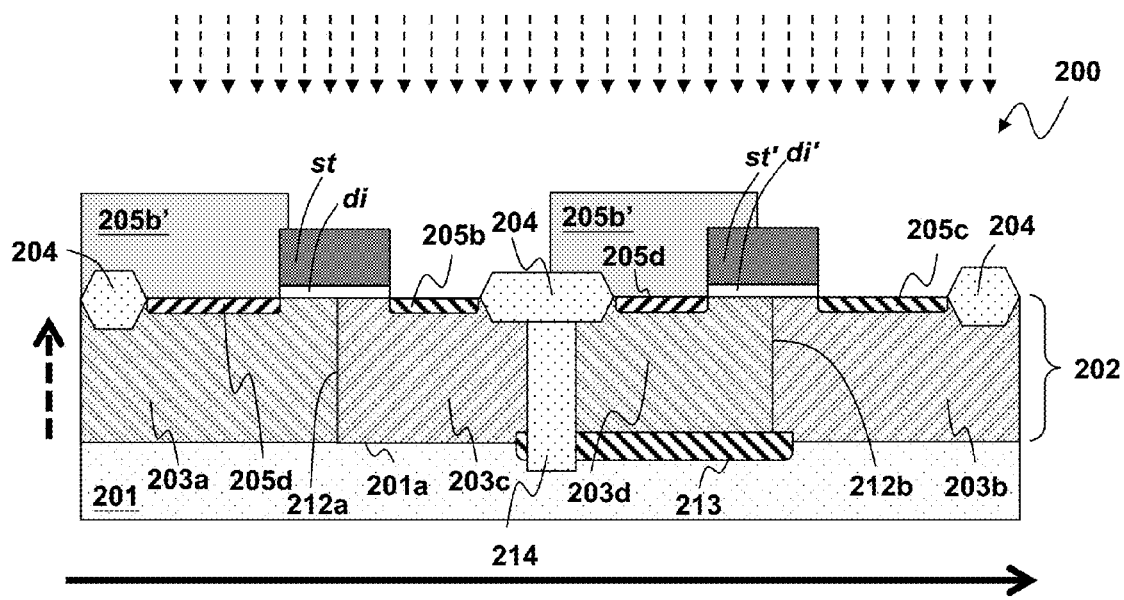

Next, as shown in FIG. 3E, ion implantation regions of the PLDD regions 205a and 205d are defined by a mask including the dielectric layers di and di', the gate conductive layers st and st', and a photoresist layer 205a'. P-type impurities are implanted into the defined ion implantation regions by an ion implantation process as indicated by thinner dashed arrows shown in the figure. Next, as shown in FIG. 3F, ion implantation regions of the NLDD regions 205b and 205c are defined by a mask including the dielectric layers di and di', the gate conductive layers st and st', and a photoresist layer 205b'. N-type impurities are implanted into the defined ion implantation regions by another ion implantation process as indicated by thinner dashed arrows shown in the figure. Note that the sequence of the steps of FIGS. 3E and 3F is interchangeable.

Figure 3G:
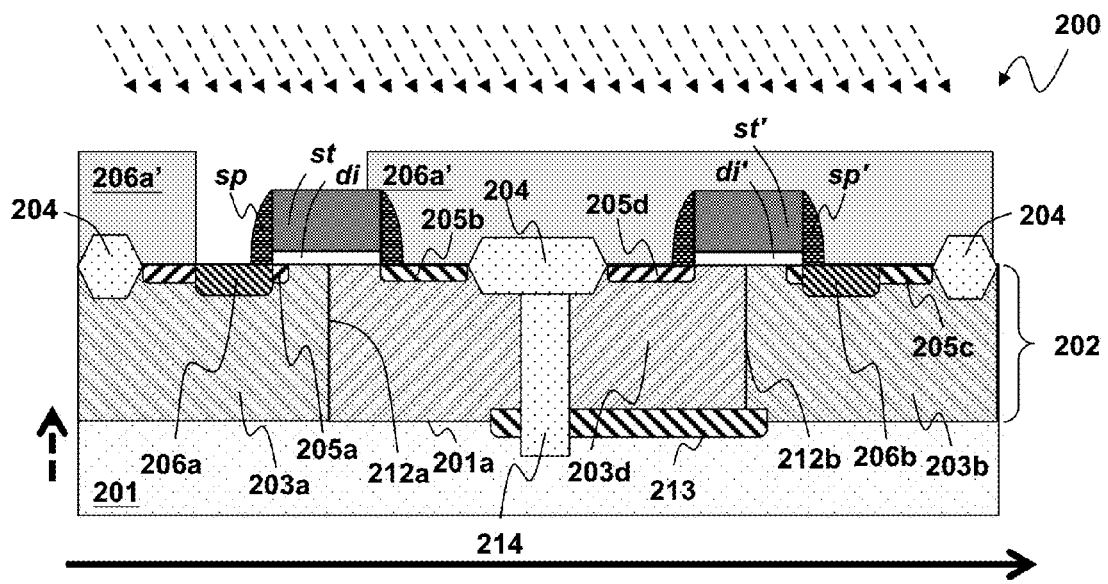

Next, as shown in FIG. 3G, a spacer layer sp is formed, and the N-type source 206a is formed on the P-well 203a in the epitaxial layer 202. The N-type source 206a is located between the epitaxial top surface 202a and the P-well 203a in the vertical direction, and the N-type source 206a connects the P-type body region 208a and the PLDD region 205a in the lateral direction. In the ion implantation process for forming the N-type source 206a as shown in FIG. 3G, the ion implantation region can be defined by a mask including the spacer layer sp, the gate conductive layer st and the photoresist layer 206a'. N-type impurities are implanted into the defined ion implantation region to form the N-type source 206a. Preferably, the ion implantation can be performed with a tilt angle with respect to the epitaxial top surface 202a as indicated by thinner dashed arrows shown in the figure, which is helpful in avoiding OFF-channel.

Figure 3H:
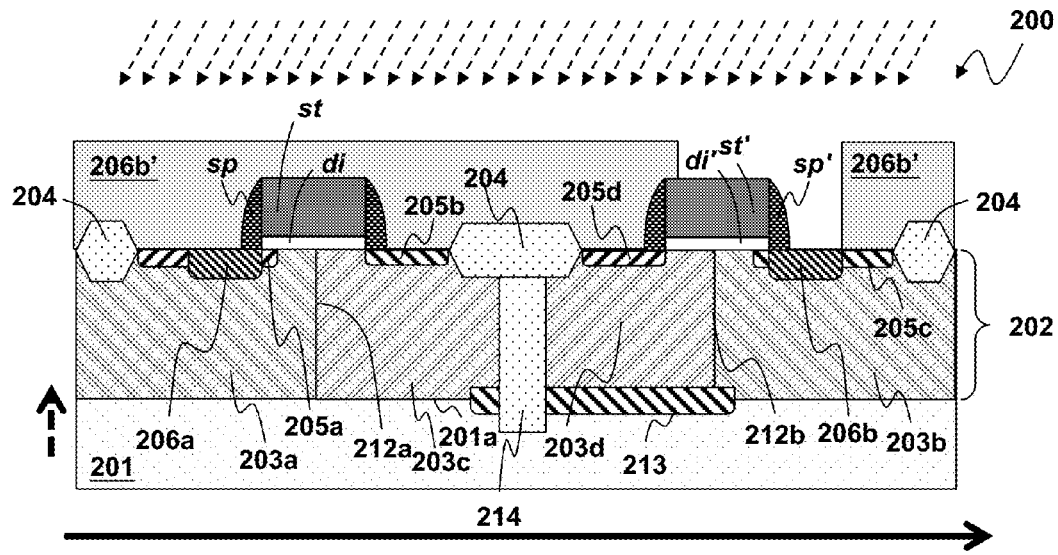

Next, as shown in FIG. 3H, a spacer layer sp' is formed, and the P-type source 206b is formed on the N-well 203b in the epitaxial layer 202. The P-type source 206b is located between the epitaxial top surface 202a and the N-well 203b in the vertical direction, and the P-type source 206b connects the N-type body region 208b and the NLDD region 205c in the lateral direction. In the ion implantation process for forming the P-type source 206b as shown in FIG. 3H, an ion implantation region can be defined by a mask including the spacer layer sp', the gate conductive layer st' and the photoresist layer 206b'. P-type impurities are implanted into the defined ion implantation region to form the P-type source 206b. Preferably, the ion implantation can be performed with a tilt angle with respect to the epitaxial top surface 202a as indicated by thinner dashed arrows shown in the figure, which is helpful in avoiding OFF-channel.

Figure 3I:
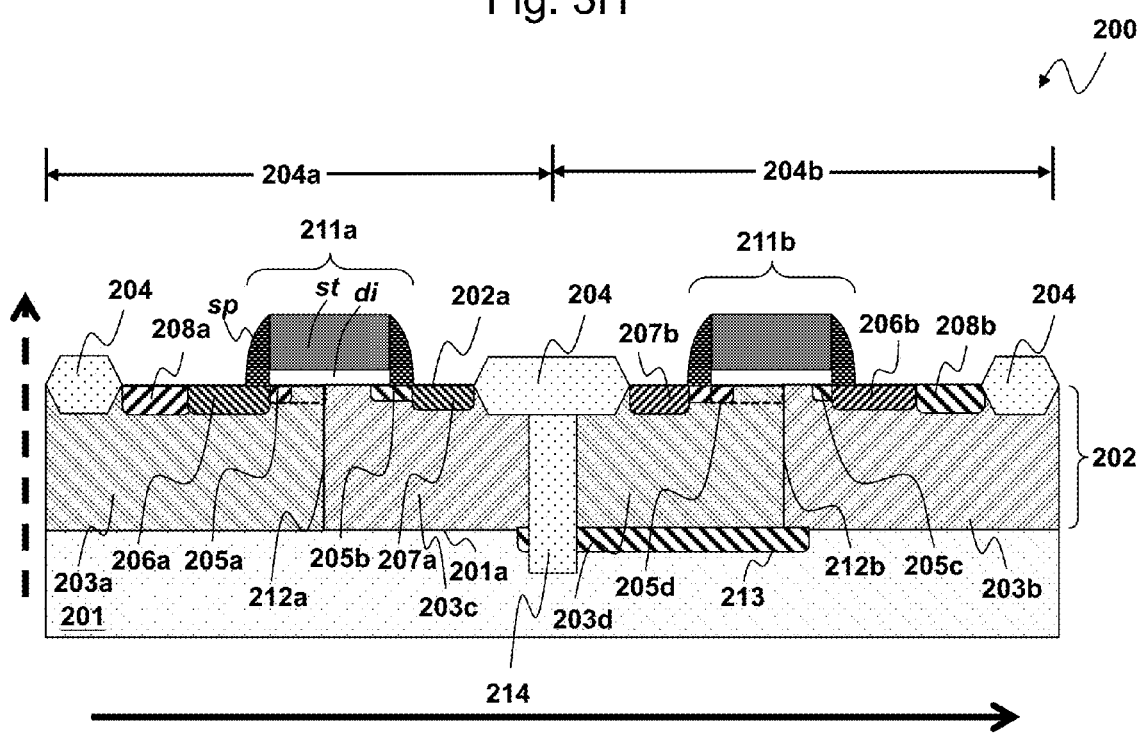

Next, as shown in FIG. 3I, the P-type body region 208a is formed on the P-type well 203a in the epitaxial layer 202. The P-type body region 208a is located between the P-well 203a and the epitaxial top surface 202a in the vertical direction. And, the N-type drain 207a is formed on the N-well 203c in the epitaxial layer 202. The N-type drain 207a is located between the epitaxial top surface 202a and the N-well 203c in the vertical direction, and the N-type drain 207a connects the NLDD region 205b in the lateral direction. A PN junction 212a is formed between the PLDD region 205a and the NLDD region 205b. In one embodiment, the ion implantation process for forming the N-type drain 207a and the ion implantation process step for forming the N-type source 206a can be integrated into one step.

Next, still referring to FIG. 3I, the N-type body region 208b is formed on the N-well 203b in the epitaxial layer 202. The N-type body region 208b is located between the N-well 203b and the epitaxial top surface 202a in the vertical direction. And, the P-type drain 207b is formed on the P-well 203d in the epitaxial layer 202. The P-type drain 207b is located between the epitaxial top surface 202a and the P-well 203d in the vertical direction, and the P-type drain 207b connects the PLDD region 205d in the lateral direction. A PN junction 212b is formed between the NLDD region 205c and the PLDD region 205d. In one embodiment, the ion implantation process for forming the P-type drain 207b and the ion implantation process step for forming the P-type source 206b can be integrated into one step.

In one preferred embodiment, the PLDD region 205a has an impurity concentration which is higher than an impurity concentration of the P-well 203a, and the NLDD region 205b has an impurity concentration which is higher than an impurity concentration of the N-well 203c. For example, the impurity concentration of the PLDD region 205a may be 2-10 folds of the impurity concentration of the P-well 203a; the impurity concentration of the NLDD region 205b may be 2-10 folds of the impurity concentration of the N-well 203b. In one preferred embodiment, the NLDD region 205c has an impurity concentration which is higher than an impurity concentration of the N-well 203b, and the PLDD region 205d has an impurity concentration which is higher than an impurity concentration of the N-well 203d. For example, the impurity concentration of the NLDD region 205c may be 2-10 folds of the impurity concentration of the N-well 203b; the impurity concentration of the PLDD region 205d may be 2-10 folds of the impurity concentration of the P-well 203d. The impurity concentration described above refers to a planar dopant concentration parameter executed in an ion implantation process. Usually, after annealing process, a three-dimensional dopant concentration is formed and the three-dimensional dopant concentration is lower than the planar dopant concentration, as well-known by one skilled in the art. By the dopant concentration design in this embodiment, the HCE of the SCE can be alleviated.

Figure 4:
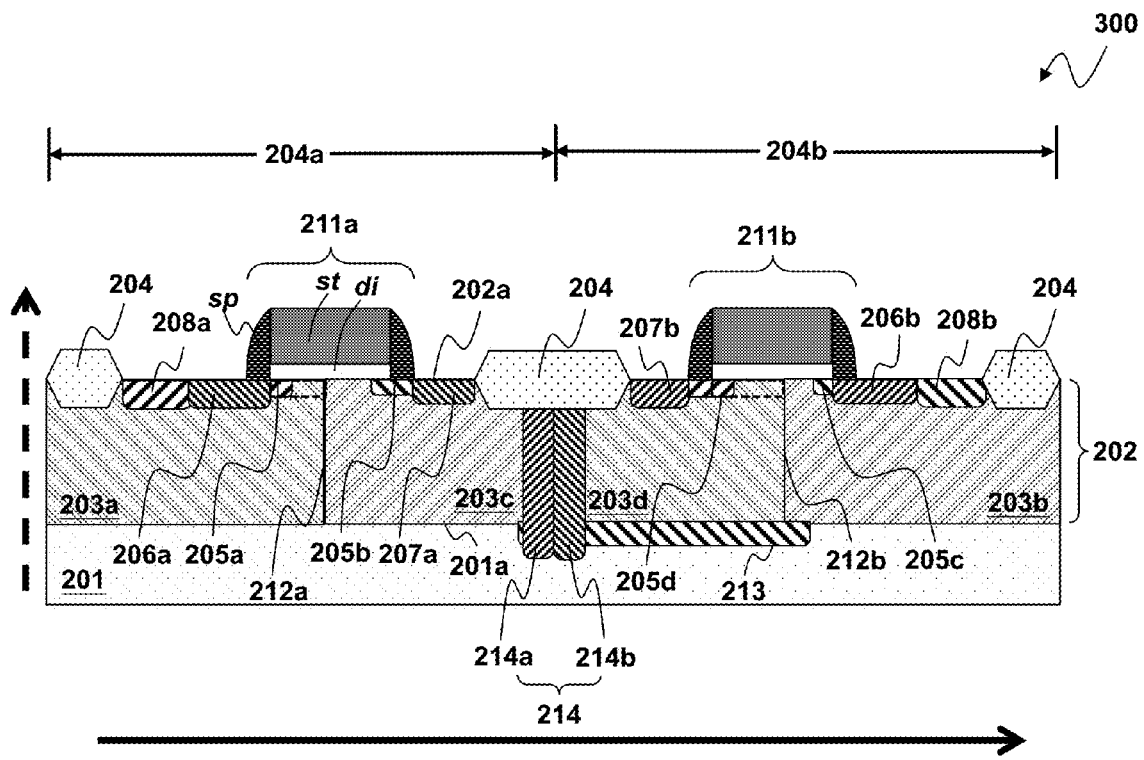
FIG. 4 shows a third embodiment of the present invention.

FIG. 4 shows a dual-well CMOS device 300 according to a third embodiment of the present invention. This embodiment is different from the first embodiment in that the separation region 214 of the dual-well CMOS device 300 of this embodiment includes a P-type separation region 214a and an N-type separation region 214b. The P-type separation region 214a is formed in the NMOS device region 204a of the epitaxial layer 202. The P-type separation region 214a upwardly connects the epitaxial top surface 202a in the vertical direction, and the P-type separation region 214a connects the N-well 203c in the lateral direction. The N-type separation region 214b is formed in the PMOS device region 204b of the epitaxial layer 202. The N-type separation region 214b upwardly connects the epitaxial top surface 202a in the vertical direction, and the N-type separation region 214b connects the P-well 203d in the lateral direction. A depth of the separation region 214, which is measured from the epitaxial top surface 202a downward, is not smaller than a depth of any of the P-well 203a, the N-well 203c, the N-well 203b, and the P-well 203d.

Figure 5:
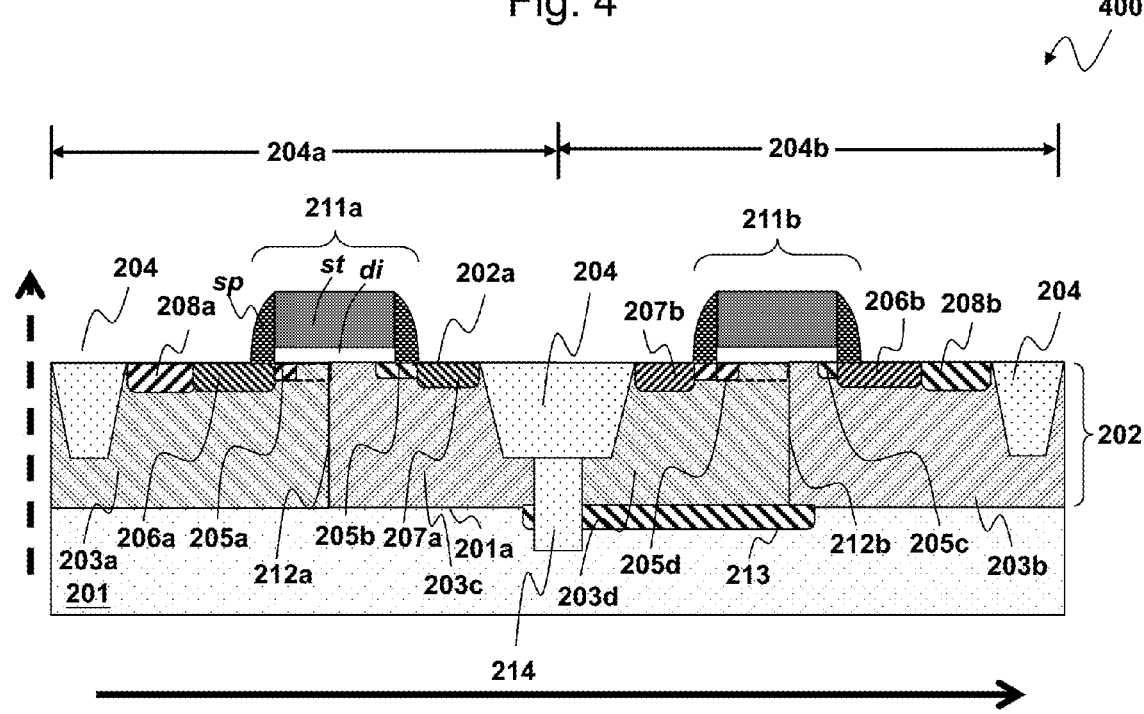
FIG. 5 shows a fourth embodiment of the present invention.

FIG. 5 shows a cross-section view of a dual-well CMOS device 400 according to a fourth embodiment of the present invention. This embodiment shows another option for forming the isolation region 204. As shown in FIG. 5, this embodiment is different from the first embodiment in that the isolation region 204 is formed by a shallow trench isolation (STI) process. Except the isolation region 204, the rest structure and manufacturing steps of the dual-well CMOS device 400 are the same as the first embodiment.

Figure 6:
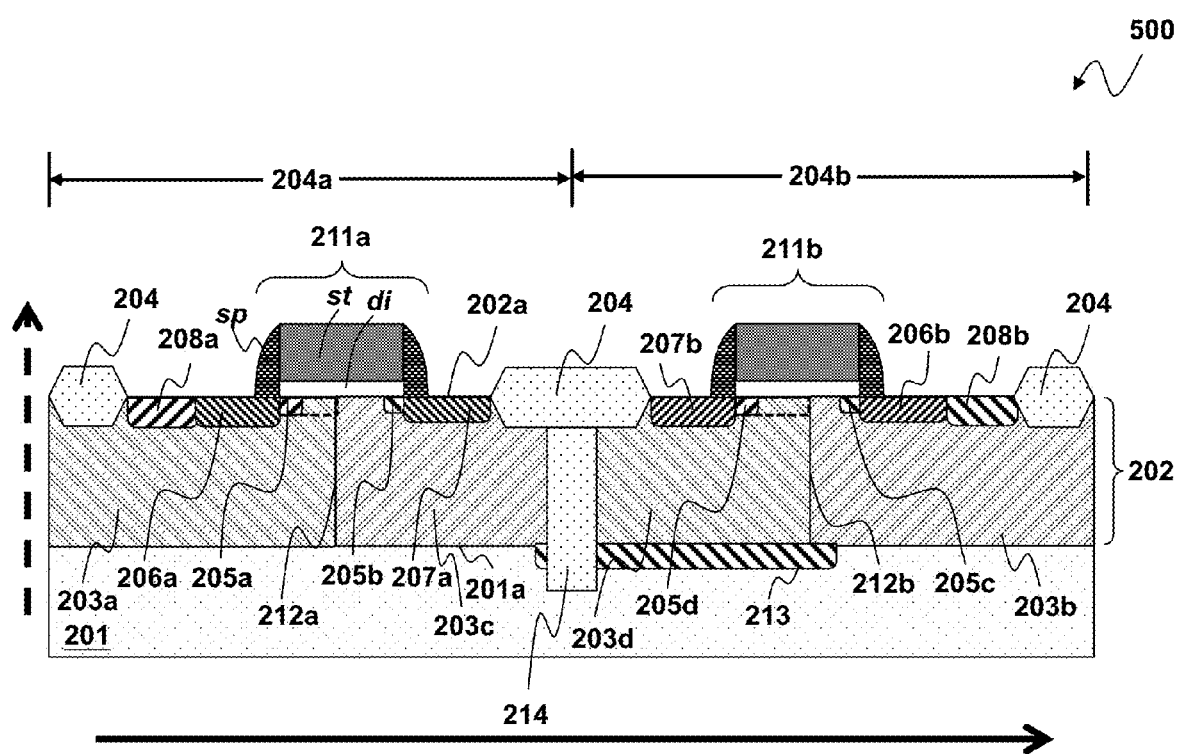
FIG. 6 shows a fifth embodiment of the present invention.

FIG. 6 shows a cross-section view of a dual-well CMOS device 500 according to a fifth embodiment of the present invention. This embodiment illustrates that, in a preferred embodiment of the present invention, the ion implantation process step for forming the N-type drain 207a and the ion implantation process step for forming the N-type source 206a can be integrated into one step. In this embodiment, the N-type impurities for forming the N-type drain 207a are implanted with a tilt angle with respect to the epitaxial top surface 202a, in the same process for forming the N-type source 206a, such that some of the N-type impurities are implanted into the epitaxial layer 202 under the spacer layer sp as shown in FIG. 6. This arrangement can reduce the manufacturing cost because it does not require a separate individual step for forming the N-type drain 207a. This embodiment also illustrates that, in a preferred embodiment of the present invention, the ion implantation process step for forming the P-type drain 207b and the ion implantation process step for forming the P-type source 206b can be integrated into one step. That is, the P-type impurities for forming the P-type drain 207b are implanted with a tilt angle with respect to the epitaxial top surface 202a, in the same process for forming the P-type source 206b, such that some of the P-type impurities are implanted into the epitaxial layer 202 under the spacer layer sp' as shown in FIG. 6. This arrangement can reduce the manufacturing cost because it does not require a separate individual step for forming the P-type drain 207b.

Figure 1:
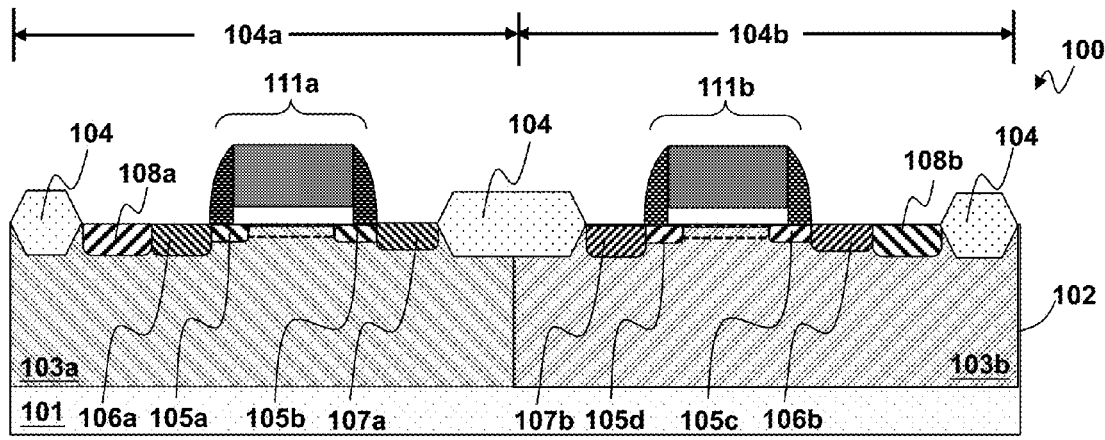
FIG. 1 shows a prior art CMOS device 100.

The present invention is different from the prior art in many aspects. There are at least four differences between the dual-well CMOS device 200 of the present invention and the prior art MOS device 100 shown in FIG. 1, as follows:

1. The dual-well CMOS device 200 includes two wells having different conductive types from each other. The N-type source 206a is on the P-well 203a, and the P-well 203a and the N-type source 206a are at the same side of the PN junction 212a. The N-type drain 207a is on the N-well 203c, and the N-well 203c and the N-type drain 207a are at the same side of the PN junction 212a. The P-type source 206a is on the N-well 203b, and the N-well 203b and the P-type source 206a are at the same side of the PN junction 212b. The P-type drain 207b is on the P-well 203d, and the P-well 203d and the P-type drain 207b are at the same side of the PN junction 212b.

2. The dual-well CMOS device 200 includes two LDD regions having different conductive types from each other in each of the NMOS device region 204a and the PMOS device region 204b. The PLDD region 205a and the P-well 203a are at the same side of the PN junction 212a. The NLDD region 205b and the N-well 203c are at the same side of the PN junction 212a. The NLDD region 205c and the N-well 203b are at the same side of the PN junction 212a. The PLDD region 205d and the P-well 203d are at the same side of the PN junction 212b.

3. The dual-well CMOS device 200 includes the aforementioned PN junction 212a, which is formed by the P-well 203a and the N-well 203c, and the aforementioned PN junction 212b, which is formed by the P-well 203d and the N-well 203b. The PN junction 212a is located between the PLDD region 205a and the NLDD region 205b. The PN junction 212b is located between the PLDD region 205d and the NLDD region 205c.

4. The dual-well CMOS device 200 includes the separation region 214, which is connected between the PMOS device region 204b and the NMOS device region 204a, wherein the depth of the separation region 214, which is measured from the epitaxial top surface 202a downward, is not smaller than the depth of any of the first P-well 203a, the N-well 203c, the N-well 203b, and the P-well 203d.

In the NMOS device region 104a of the prior art CMOS device 100, when a bias voltage is applied to the gate 111a, a channel is formed at the interface between the P-well 103a and the dielectric layer of the gate 111a (as shown by the dash square in FIG. 1) by attracting carriers. When the bias voltage changes, the number of the attracted carriers correspondingly changes, and the electrical field near the channel changes, whereby a current is generated and controlled, as well-known by one skilled in the art. However, in the NMOS device region 204a of the dual-well CMOS device 200 of the present invention, the channel is defined by the N-type source 206a and the P-well 203a, which is different from the prior art CMOS device 100 in which the channel is defined by the NLDD region 105a (same side as the N-type source 106a) and the NLDD region 105b (same side as the N-type drain 107a). The channel of the NMOS device region 204a of the dual-well CMOS device 200 is shown by the dash square in FIG. 2. To achieve the same electrical effect, the channel of the present invention is relatively shorter, so the conduction resistance through the channel is relatively lower. Besides, because the impurity concentration of the PLDD region 205a is higher than the impurity concentration of the P-well 203a, the SCE is suppressed. Further, in the prior art CMOS device 100, the breakdown occurs at the junction between the NLDD region 105b and the P-well 103a; because the impurity concentration of the NLDD region 105b is relatively high, the breakdown voltage is correspondingly low. In the dual-well CMOS device 200 of the present invention, the breakdown occurs at the PN junction 212a; because the impurity concentration of the N-well 203c is relatively low, the breakdown voltage is correspondingly high, and the hot carrier effect is better suppressed. In the PMOS device region 204b of the CMOS device 200 according to the present invention, the breakdown voltage is relatively higher than the prior art CMOS device 100, and the hot carrier effect is better suppressed than the prior art CMOS device 100 with the aforementioned reasons.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography or other lithography techniques. For another example, variations of one embodiment can be applied to other embodiments; for example, the separation region 214 which includes the P-type separation region 214a and the N-type separation region 214b shown in FIG. 4 can be adopted in the embodiments shown in FIGS. 5 and 6. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A dual-well complementary metal oxide semiconductor (CMOS) device, comprising:
   a substrate, including a top surface and a bottom surface opposite to the top surface in a vertical direction;
   an epitaxial layer, which is formed on and connects at least a portion of the top surface of the substrate, the epitaxial layer including an epitaxial top surface opposite to the top surface in the vertical direction;
   an isolation region, which is formed on the epitaxial layer, and configured to define an NMOS device region and a PMOS device region in the epitaxial layer;
   a first P-type well (P-well), which is formed in the NMOS device region of the epitaxial layer and located under the epitaxial top surface in the vertical direction;
   a P-type body region, which is formed on the first P-well in the epitaxial layer, and is located between the first P-well and the epitaxial top surface in the vertical direction;
   a first N-type well (N-well), which is formed in the NMOS device region of the epitaxial layer and located under the epitaxial top surface in the vertical direction, and connects the first P-well in a lateral direction, to form a first PN junction between the first N-well and the first P-well;
   a first gate, which is formed in the NMOS device region, and is stacked on and connects the epitaxial top surface in the vertical direction;
   a first P-type lightly doped diffusion (PLDD) region, which is formed on the first P-well in the epitaxial layer, and is located between the epitaxial top surface and the first P-well in the vertical direction;
   a first N-type lightly doped diffusion (NLDD) region, which is formed on the first N-well in the epitaxial layer, and is located between the epitaxial top surface and the first N-well in the vertical direction;
   an N-type source, which is formed on the first P-well in the epitaxial layer, and is located between the epitaxial top surface and the first P-well in the vertical direction, wherein the N-type source connects the P-type body region and the first PLDD region in the lateral direction;
   an N-type drain, which is formed on the first N-well in the epitaxial layer, and is located between the epitaxial top surface and the first N-well in the vertical direction, wherein the N-type drain connects the first NLDD region in the lateral direction;
   a second N-type well (N-well), which is formed in the PMOS device region of the epitaxial layer and located under the epitaxial top surface in the vertical direction;
   an N-type body region, which is formed on the second N-well in the epitaxial layer, and is located between the second N-well and the epitaxial top surface in the vertical direction;
   a second P-type well (P-well), which is formed in the PMOS device region of the epitaxial layer and located under the epitaxial top surface in the vertical direction, and connects the second N-well in the lateral direction, to form a second PN junction between the second N-well and the second P-well;
   a second gate, which is formed in the PMOS device region, and is stacked on and connects the epitaxial top surface in the vertical direction;
   a second N-type lightly doped diffusion (NLDD) region, which is formed on the second N-well in the epitaxial layer, and is located between the epitaxial top surface and the second N-well in the vertical direction;
   a second P-type lightly doped diffusion (PLDD) region, which is formed on the second P-well in the epitaxial layer, and is located between the epitaxial top surface and the second P-well in the vertical direction;
   a P-type source, which is formed on the second N-well in the epitaxial layer, and is located between the epitaxial top surface and the second N-well in the vertical direction, wherein the P-type source connects the N-type body region and the second NLDD region in the lateral direction;
   a P-type drain, which is formed on the second P-well in the epitaxial layer, and is located between the epitaxial top surface and the second P-well in the vertical direction, wherein the P-type drain connects the second PLDD region in the lateral direction; and
   a separation region, which is connected between the PMOS device region and the NMOS device region, for separating the PMOS device region and the NMOS device region, wherein a depth of the separation region, which is measured from the epitaxial top surface downward, is not smaller than a depth of any of the first P-well, the first N-well, the second N-type well, and the second P-well;
   wherein, the first PN junction is located between the first PLDD region and the first NLDD region;
   wherein, the second PN junction is located between the second PLDD region and the second NLDD region.

2. The dual-well CMOS device of claim 1, wherein the isolation region includes a local oxidation of silicon (LOCOS) structure or a shallow trench isolation (STI) structure.

3. The dual-well CMOS device of claim 1, wherein an impurity concentration of the first PLDD region is higher than an impurity concentration of the first P-well, and an impurity concentration of the first NLDD region is higher than an impurity concentration of the first N-well.

4. The dual-well CMOS device of claim 1, wherein an impurity concentration of the second PLDD region is higher than an impurity concentration of the second P-well, and an impurity concentration of the second NLDD region is higher than an impurity concentration of the second N-well.

5. The dual-well CMOS device of claim 1, further comprising an N-type buried layer, which is formed at or around an interface between the substrate and the epitaxial layer, the N-type buried layer upwardly connecting the second P-well in the vertical direction.

6. The dual-well CMOS device of claim 1, wherein the separation region includes a deep trench isolation (DTI) structure.

7. The dual-well CMOS device of claim 1, wherein the separation region includes:
   a P-type separation region, which is formed in the NMOS device region of the epitaxial layer, the P-type separation region upwardly connecting the epitaxial top surface in the vertical direction, and the P-type separation region laterally connecting the first N-well in the lateral direction; and
   an N-type separation region, which is formed in the PMOS device region of the epitaxial layer, the N-type separation region upwardly connecting the epitaxial top surface in the vertical direction, and the N-type separation region laterally connecting the second P-well in the lateral direction.

8. A manufacturing method of a dual-well complementary metal oxide semiconductor (CMOS) device, comprising:
   providing a substrate, which includes a top surface and a bottom surface opposite to the top surface in a vertical direction;

forming an epitaxial layer on and connecting at least a portion of the top surface of the substrate, the epitaxial layer including an epitaxial top surface opposite to the top surface in the vertical direction;

forming an isolation region on the epitaxial layer, to define an NMOS device region and a PMOS device region in the epitaxial layer;

forming a first P-type well (P-well) in the NMOS device region of the epitaxial layer, under the epitaxial top surface in the vertical direction;

forming a P-type body region on the first P-well in the epitaxial layer, between the first P-well and the epitaxial top surface in the vertical direction;

forming a first N-type well (N-well) in the NMOS device region of the epitaxial layer, under the epitaxial top surface in the vertical direction, wherein the first N-well connects the first P-well in a lateral direction, to form a first PN junction between the first N-well and the first P-well;

forming a first gate in the NMOS device region, wherein the first gate is stacked on and connects the epitaxial top surface in the vertical direction;

forming a first P-type lightly doped diffusion (PLDD) region on the first P-well in the epitaxial layer, between the epitaxial top surface and the first P-well in the vertical direction;

forming a first N-type lightly doped diffusion (NLDD) region on the first N-well in the epitaxial layer, between the epitaxial top surface and the first N-well in the vertical direction;

forming an N-type source on the first P-well in the epitaxial layer, between the epitaxial top surface and the first P-well in the vertical direction, wherein the N-type source connects the P-type body region and the first PLDD region in the lateral direction;

forming an N-type drain on the first N-well in the epitaxial layer, between the epitaxial top surface and the first N-well in the vertical direction, wherein the N-type drain connects the first NLDD region in the lateral direction;

forming a second N-type well (N-well) in the PMOS device region of the epitaxial layer, under the epitaxial top surface in the vertical direction;

forming an N-type body region on the second N-well in the epitaxial layer, between the second N-well and the epitaxial top surface in the vertical direction;

forming a second P-type well (P-well) in the PMOS device region of the epitaxial layer, under the epitaxial top surface in the vertical direction, wherein the second P-well connects the second N-well in a lateral direction, to form a second PN junction between the second N-well and the second P-well;

forming a second gate in the PMOS device region, wherein the second gate is stacked on and connects the epitaxial top surface in the vertical direction;

forming a second N-type lightly doped diffusion (NLDD) region on the second N-well in the epitaxial layer, between the epitaxial top surface and the second N-well in the vertical direction;

forming a second P-type lightly doped diffusion (PLDD) region on the second P-well in the epitaxial layer, between the epitaxial top surface and the second P-well in the vertical direction;

forming a P-type source on the second N-well in the epitaxial layer, between the epitaxial top surface and the second N-well in the vertical direction, wherein the P-type source connects the N-type body region and the second NLDD region in the lateral direction;

forming a P-type drain on the second P-well in the epitaxial layer, between the epitaxial top surface and the second P-well in the vertical direction, wherein the P-type drain connects the second PLDD region in the lateral direction; and forming a separation region, which is connected between the PMOS device region and the NMOS device region, for separating the PMOS device region and the NMOS device region, wherein a depth of the separation region, which is measured from the epitaxial top surface downward, is not smaller than a depth of any of the first P-well, the first N-well, the second N-well, and the second P-well;

wherein, the first PN junction is located between the first PLDD region and the first NLDD region;

wherein, the second PN junction is located between the second PLDD region and the second NLDD region.

9. The manufacturing method of claim 8, wherein the isolation region includes a local oxidation of silicon (LOCOS) structure or a shallow trench isolation (STI) structure.

10. The manufacturing method of claim 8, wherein an impurity concentration of the first PLDD region is higher than an impurity concentration of the first P-well, and an impurity concentration of the first NLDD region is higher than an impurity concentration of the first N-well.

11. The manufacturing method of claim 8, wherein an impurity concentration of the second PLDD region is higher than an impurity concentration of the second P-well, and an impurity concentration of the second NLDD region is higher than an impurity concentration of the second N-well.

12. The manufacturing method of claim 8, further comprising: forming an N-type buried layer, which is formed at or around an interface between the substrate and the epitaxial layer, the N-type buried layer upwardly connecting the second P-well in the vertical direction.

13. The manufacturing method of claim 8, wherein the separation region includes a deep trench isolation (DTI) structure.

14. The manufacturing method of claim 8, wherein the separation region includes:

a P-type separation region, which is formed in the NMOS device region of the epitaxial layer, the P-type separation region upwardly connecting the epitaxial top surface in the vertical direction, and the P-type separation region laterally connecting the first N-well in the lateral direction; and an N-type separation region, which is formed in the PMOS device region of the epitaxial layer, the N-type separation region upwardly connecting the epitaxial top surface in the vertical direction, and the N-type separation region laterally connecting the second P-well in the lateral direction.

* * * * *